United States Patent [19]

Akimitsu et al.

[11] Patent Number: 5,019,553
[45] Date of Patent: May 28, 1991

[54] $SR_2(BI_{1-a}PBA)_xCU_yO_z$ METAL OXIDE MATERIAL

[75] Inventors: Jun Akimitsu; Tohru Den, both of Tokyo, Japan

[73] Assignee: Canon Kabushiki Kaisha, Tokyo, Japan

[21] Appl. No.: 283,924

[22] Filed: Dec. 13, 1988

[30] Foreign Application Priority Data

Dec. 17, 1987 [JP] Japan .................................. 62-317579

[51] Int. Cl.$^5$ .................... C01F 11/02; C01G 3/02; C01G 29/00; H01L 39/12
[52] U.S. Cl. ........................................ 505/1; 252/521; 423/604; 423/617; 423/618; 423/635; 501/123; 505/782
[58] Field of Search ......................... 501/123; 252/521; 423/604, 618, 617, 635; 505/1, 782

[56] References Cited

U.S. PATENT DOCUMENTS 3,932,315  1/1976  Sleight ................................ 252/521
4,870,052  9/1989  Engler et al. ....................... 505/1
4,880,771  11/1989  Cava et al. ......................... 423/635

OTHER PUBLICATIONS

Michel, "Superconductivity in the Bi-Sr-Cu-O System", Z. Phys. B-Condensed Mate-68, Oct 27, 1987, pp. 421–423.
Holdar, "Bulk Superconductivity at 122k in Tl(Bu,Cal$_2$ Cu$_3$ Cu$_y$O . . . ", Science, vol. 241, Sep. 2, 1988, pp. 1198–1200.
Holdar, "A New Intermediate-Tc Oxide Superconductor . . . ", Mater. Lett. 7(1-2) 198: pp. 1–4 (Abstract only).
CRC Handbook of Chemistry and Physics, ed: Weart & Astle, CRC Press, 1982–1983, 63rd Edition, pp. B-8 & B-41-2.
Hackh's Chemical Dictionary by Hackh & Grant, 2nd Ed., P. Blakiston's Son & Co. Inc.; 1938, pp. 929-8.
Zeitschrift fuer Physik, B. Condensed Matter, Berlin et al., "Superconductivity in the Bi-Sr-Cu-O System", vol. 68, 1987, pp. 421–423.
Nature, Sheng et al., "Superconductivity in the Rare-Earth-Free Tl-Ba-Cu-O System Above Liquid-Nitrogen Temperature", vol. 332, 3 Mar. 1988, pp. 55–58.
Japanese Journal of Applied Physics, Part 2, Akimitsu et al., "Superconductivity in the Bi-Sr-Cu-O System", vol. 26, No. 12, 1 Dec. 1987, pp. 2080, 2081.
Pre Scripts for Lecture Series in the Section Party in 1990 Autumn, vol. 3, p. 246, No. 28p-PS-20, "Superconductivity of Bi-Sr-Cu-O".
Frank, "Superconductivity in Systems of Composition . . . ", Rev. of Solid State Science, vol. 1, No. 2 (1987), pp. 405–410.
Richert, "Atomic Substitution in YBa$_2$Cu$_3$O$_7$: Modification . . . ", Amer. Vac. Soc. Series 3, Nov. 6, 1987, pp. 277–283.
Hor, "Superconductivity Above 90K in the Square-Planar . . . ", Pys. Rev. Lett., May 4, 1987, pp. 1891–1894.
Capone, "Upper Critical Fields and High Superconductivity Trans . . . ", Appl. Phys. Ltt. 50(9), Mar. 2, 1987, pp. 543–544.

*Primary Examiner*—Paul Lieberman
*Assistant Examiner*—John Boyd
*Attorney, Agent, or Firm*—Fitzpatrick, Cella, Harper & Scinto

[57] ABSTRACT

A metal oxide material is provided which is represented by the composition formula:

$A_2B_xCu_yO_z$ wherein $2 \leq x \leq 3.5$, $2 \leq y \leq 3.5$, $x+y>4$, and $4<z$; A is an element or a group of elements selected from alkaline earth metal elements; and B is an element or a group of elements selected from the group of elements consisting of bismuth, lead and thallium. The material has a superconductivity transition temperature of from 4.2K to 12K.

2 Claims, No Drawings

$Sr_2(Bi_{1-a}Pb_a)_xCu_yO_z$ METAL OXIDE MATERIAL

BACKGROUND OF THE INVENTION

1. Field of the invention

The present invention relates to a copper material useful as a superconductive material.

2. Related Background Art

Hitherto known as copper oxides are CuO and $Cu_2O$, as well as $CuGeO_3$, $CuNbO_3$, $CuVO_3$, $Bi_2CuO_4$, $Cr_2CuO_4$, $La_2CuO_4$, et. Of these, $La_{2-x}A_xCuO_4$ (A=Ca, Sr or Ba) and $LnBa_2Cu_3O_y$ (Ln=Y or lanthanoids) are known as superconductive materials.

However, in the conventional superconductive materials comprising copper oxides, the yttrium and lanthanoids that are component elements of the materials have been expensive materials because of their small amounts of the resource. In instances in which these copper oxides are formed into sinters or thin films depending on what they are used for, high temperatures of about 1,000° C. are required as reaction temperature, bringing about the problems that a high production cost results and there are considerable limitations on substrates to be used. Moreover, they also can be formed into single crystals with difficulty, and with restricted reaction conditions, so that no large single crystal has ever been obtained. Furthermore, deviation in compositional ratios may greatly affect the superconductivity transition temperature (hereinafter "Tc"), having brought about the problem that the materials exhibit no superconductivity Within the range of $x \geq 0.2$ in, for example, $Y_{1+x}Ba_{2-x}Cu_3O_7$. This is particularly a great problem since the compositional deviation becomes liable to occur When thin films are prepared.

Z. Phys. B-Condensed Matter 68, 421-423 (1987) discloses a novel Bi-based superconductive material, having its composition of $Sr_2Bi_2Cu_2O_{7+\delta}$, Tc of 7 to 22 K in the midpoint. This Bi-based superconductive material does not employ any expensive raw materials such as Y and lanthanoids as its component elements, can be formed using reaction temperatures of not higher than 900° C., can be inexpensive when compared with conventional $La_{2-x}A_xCuO_4$ and $LnBa_2Cu_3O_y$, and can afford to accept a broader scope of selection in respect of the materials for substrates when thin films are formed, and thus can be said to be superior materials in these respects. They, however, have the problems such that the Tc tends to be extremely lowered because of inclusion of impurities and it is difficult to obtain a superconductive material having a stable Tc.

SUMMARY OF THE INVENTION

An object of the present invention is to provide a novel copper oxide material useful as a superconductive material that does not require any expensive raw materials such as Y and lanthanoid elements and can be readily cooled by liquid helium.

Another object of the present invention is to provide a novel superconductive copper oxide material that can be formed at a low reacting temperature and enables easy preparation of single crystals.

Still another object of the present invention is to provide a copper oxide material useful as a superconductive material whose Tc can be less affected even by the compositional deviation and presence of a small amount of impurities.

The above objects can be achieved by the present invention described below.

The present invention is a metal oxide material represented by the compositional formula:

$$A_xB_xCu_yO_z$$

wherein $2 \leq x \leq 3.5$, $2 \leq y \leq 3.5$, $x+y>4$, and $4<z$;
A is an element or a group of elements selected from alkaline earth metal elements; and B is an element or a group of elements selected from the group of elements consisting of bismuth, lead and thallium.

In a preferred embodiment of the present invention, the above metal oxide material has a superconductivity transition temperature of from 4.2K to 12K.

DETAILED DESCRIPTION OF THE PREFERRED EMBODIMENTS

In the present invention, the copper oxide material particularly suitable for the objects of the present invention is a material represented by the compositional formula:

$$A_xB_xCu_yO_z$$

wherein $2 \leq x \leq 3.5$, $2 \leq y \leq 3.5$, $x+y>4$, and $4<z$;
A is an element or a group of elements selected from alkaline earth metal elements; and B is an element or a group of elements selected from the group of elements consisting of bismuth, lead and thallium.

Preferably used as the alkaline earth metal are calcium, strontium and barium.

In the above composition, preferred combination of the element or the group of elements includes:
(1) $Sr_2Bi_xCu_yO_z$
  $(2) \leq 2 \leq 3.5$, $2 \leq y \leq 3.5$, $4.5 \leq x+y \leq 5.5$, $4<z)$
(2) $Ba_2Tl_xCu_yO_z$
  $(2) \leq 2 \leq 3.5$, $2 \leq y \leq 3.5$, $4.5 \leq x+y \leq 5.5$, $4<z)$
(3) $Sr_2(Bi_{1-a}Pb_a)_xCu_yO_z$
  $(2 \leq x \leq 3.5$, $2 \leq y \leq 3.5$, $4.5 \leq x+y \leq 5.5$, $4<z$, $O<a<).4)$
(4) $Sr_2(Bi_{1-a}Tl_a)_xCu_yO_z$
  $(2 \leq x \leq 3.5$, $2 \leq y \leq 3.5$, $4.5 \leq x+y \leq 5.5$, $4<z$, $O<a<1)$ Of the copper oxide materials represented by the above composition formulas (1) to (4), a material $Sr_2Bi_{3-x}Cu_2O_z$, where $O<x<1$, in the compositional formula (1) is superior from the view point of practical use because of its good crystallinity and less possiblity for the Tc to be affected by the compositional deviation, particularly when a thin film there of is prepared.

Of the materials having the composition of the above (1) to (4), those having an ortho-rhombic crystalline structure and having a lattice constant of a=24 to 25 Å, b=C=5.3 to 5.4 Å are preferred because of their relatively high Tc.

As method of preparing the above oxide materials of the present invention, it is possible in the present invention to use any of reaction and sintering methods utilizing the heating of raw materials powders generally used in ceramic materials.

Examples of such methods are disclosed in Material Research Bulletin Vol. 8, p.777 (1973); Solid State Communication, VoI. 17, p.27 (1975); Zeitschrift fur Physik, Vol. B-64, p.189 (1986); Physical Review Letters, Vol. 58, No. 9, p.908 (1987); etc., and these methods are presently known as qualitatively very common methods.

A method of effecting single-crystal growth after a raw material powder has been melted at a high temperature is also useful in the present invention. Additionally, the material of the present invention may formed on a substrate in the form of a thin film by means of sputtering such as radio frequency sputtering or magnetron sputtering, using a target containing raw materials, electron beam vapor deposition, or other vacuum vapor deposition, as well as a cluster ion beam method, or CVD or plasma CVD employing gaseous materials as raw materials. In such instances, it is en effective to feed gaseous oxygen to the apparatus to carry out oxidation therein. More specific examples of conditions for the preparation will be described in Examples herein set out below.

The thus obtained oxide material of the present invention, which is mainly composed of copper oxide does not exhibit any metal-nonmetal transition, has an electrical resistively of about $10^{-4}$ to $10^{-4}$ $\Omega$·cm at room temperature, and exhibits a superconductivity at temperatures of from several K to about 10K.

A preferable superconductivity can be obtained when x, y and z are respectively within the above range in the above compositional formula. No preferable superconductivity can result outside the above range.

The raw materials used in the present invention are all inexpensive, promising a low raw material cost, so that the oxide material of the present invention can be provided through an inexpensive route. For example, the oxide material of the present invention can be provided through an inexpensive route even when compared with a series of the compounds represented by $YBa_2Cu_3O_{7-z}$. Also, the oxide material of the present invention is relatively stable with less deterioration in the air as compared with the above compounds, and may suffer less deterioration by moisture. Since in addition the Tc of the resulting oxide material is higher than the liquid helium temperature (4.2K), it can be relatively easily used as the superconductive material.

It is also possible to control the reacting temperature in preparing the material, to as low as 900° C. or lower, and also achieve good crystallinity.

A practical useful copper oxide material can also be obtained wherein superconducting transition temperature is less affected by the compositional deviation.

EXAMPLES

The present invention will be described below in greater detail by giving Examples. The Tc shown in the following indicates the zero resistance temperature in every instance.

EXAMPLES 1 TO 5, COMPARATIVE EXAMPLES 1 TO 4

$Bi_2O_3$, $SrCo_3$ and CuO as raw materials were weighted to give the compositional ratios as shown in Table 1 below, followed by dry mixing. The resulting mixtures were each press-molded into a pellet of 10 nm in diameter and 1 nm in thickness, and the molded products were each reacted and sintered on an alumina boat at 900° C. in the air, thus preparing copper oxide materials of the present invention and those of Comparative Examples.

The superconductivity of each oxide thus prepared was measured in a temperature range of from 3K to 50K. Results obtained are shown in Table 1 below.

As will be evident from Table 1, the oxide materials of the present invention exhibit the superconductivity, while the oxide materials of Comparative Examples exhibited no satisfactory superconductivity within the range of the measurement temperatures.

X-ray diffraction of the samples of Examples 1, 2 and 3, having particularly good characteristics, was also conducted. The unit cell was orthorhombic, and a=24.6 Å, b=5.38 Å and c=5.38 Å.

TABLE 1

| Samples | Components (molar ratio) | | | | |
|---|---|---|---|---|---|
| | Sr | Bi | Cu | O | Tc |
| Example: | | | | | |
| 1 | 2 | 3 | 2 | 8.5 | 9 |
| 2 | 2 | 2.5 | 2.5 | 8.3 | 10 |
| 3 | 2 | 2 | 3 | 8 | 9 |
| 4 | 2 | 3 | 3 | 9 | 7 |
| 5 | 2 | 2.5 | 3.5 | 9 | 6 |
| Comparative Example: | | | | | |
| 1 | 2 | 2 | 4 | 9 | 3 |
| 2 | 2 | 1 | 2 | 5.5 | — |
| 3 | 2 | 2 | 2 | 7 | 4 |
| 4 | 2 | 4 | 1 | 9 | — |

The mark "—" in the column for Tc indicates that no superconductivity transition took place at 3K or higher.

EXAMPLES 6 AND 7, COMPARATIVE EXAMPLES 5 AND 6

Using $Tl_2O_3$, BaO and CuO as raw materials, pellets were prepared in the same manner as in the above Examples, encapsulated in Ag pipes, and reacted at 900° C. Results obtained are shown in Table

TABLE 2

| Samples | Ba | Tl | Cu | Tc (K) |
|---|---|---|---|---|
| Example: | | | | |
| 6 | 2 | 2.5 | 2.5 | 12 |
| 7 | 2 | 3 | 2 | 8 |
| Comparative Example: | | | | |
| 5 | 2 | 2 | 2 | — |
| 6 | 2 | 1 | 2 | — |

EXAMPLE 8, COMPARATIVE EXAMPLE 7

In instances in which a thin film comprising the oxide materials of the present invention is formed on a substrate, three sets of crucibles and electron sources are first disposed in a vapor deposition apparatus, and bismuth, strontium and copper are introduced into three the crucibles. Using magnesium oxide (MgO) as a substrate, he inside of a vacuum chamber is exhausted to $2\times10^{-7}$ Torr, and thereafter the substrate is heated to 600° C. using a substrate heater. Next, while introducing oxygen ($O_2$) into the vacuum chamber at a flow rate of 1 SCCM, vapor deposition is started. Following the procedures known in general in the art, deposition rate of the bismuth, strontium and copper is monitored and feed back is effected on electron beams to control the rate so that the ratio of strontium:bismuth:copper may be 2:2.5:2.5 or 2:2:2. After deposition of a film of a thickness of about 5,000 Å has been completed, the substrate temperature is sufficiently dropped, and the products are taken out in the air, followed by annealing in the air at 800° C. for several hours to about 10 hours. The superconductivity of the thin-filmy oxide materials thus obtained was measured in a temperature range of from 3K to 50K. Results obtained are shown below.

| Samples | Sr | Bi | Cu | Tc (K) |
| --- | --- | --- | --- | --- |
| Example 8 | 2 | 2.5 | 2.5 | 7 |
| Comparative Example 7 | 2 | 2 | 2 | 3 |

EXAMPLES 9 TO 12, COMPARATIVE EXAMPLES 8 TO 10

Using $Bi_2O_3$, $SrCO_3$, $PbO_2$, $Tl_2O_3$ as raw materials, mixing and press-molding were carried out in the same manner as in Example 1, followed by reaction and sintering of alumina boat at 800° C., to obtain four kings of copper oxides $Sr_2Bi_2PbCu_2O_y$, $Sr_2Tl_3Cu_2O_y$, $Sr_2Bi_2TlCu_2O_y$ and $Sr_2Bi_{2.5}Pb_{0.5}Cu_3O_y$. Resistance measurement was effected at 4.2K or higher to find that all four kinds exhibited superconductivity at near 9K.

For comparison, three kinds of copper oxides $Sr_2Bi_{1.5}Pb_{0.5}Cu_2O_y$, $Sr_2Tl_2Cu_2O_y$ and $Sr_2Bi_{1.5}Tl_{0.5}Cu_2O_y$ were prepared under the same conditions, but resulted in no exhibition of superconductivity at 4.2K or higher.

We claim:

1. A superconductive metal oxide material represented by the compositional formula:

$$Sr_z(Bi_{1-a}Pb_a)_xCu_yO_z$$

wherein $0.166 \leq a < 0.4$
$2 \leq X \leq 3.5$
$2 \leq Y \leq 3.5$
$X + y \geq 5$
$4 < Z$;
in said compositional formula.

2. The metal oxide material of claim 1, wherein electrical resistance disappear at a temperature higher than the boiling point of liquid helium.

* * * * *

UNITED STATES PATENT AND TRADEMARK OFFICE
CERTIFICATE OF CORRECTION

PATENT NO. : 5,019,553
DATED : May 28, 1991
INVENTOR(S) : Jun Akimitsu, et al Page 1 of 4

It is certified that error appears in the above-identified patent and that said Letters Patent is hereby corrected as shown below:

On the title page:

IN [54] TITLE

"$SR_2(BI_{1-a}PBA)_xCU_yO_z$" should read --$SR_2(BI_{1-a}PB_a)_xCU_yO_z$--.

IN [56] REFERENCES CITED

OTHER PUBLICATIONS:

Under "Holdar" (first occurrence), "Holdar" should read --Haldar-- and "$Tl(Bu,Cal_2Cu_3\ Cu_yO$" should read --$Tl(Ba,Ca)_2Ca_3Cu_4O_{10-5+6}$--;

Under "Holdar" (second occurrence), "Holdar" should read --Haldar-- and "198:" should read --1988:--.

Under "CRC Handbook", "Weart" should read --Weast-- and "B-41-2." should read --B-41-42.--.

Under "Hack's", "pp. 929-8." should read --pp. 929-30.--.

Under "Hor", "Pys." should read --Psy.--.

Insert: --Varadaraju, "Effect of Chemical Substitution on the High-Tc ..." Physics. 148B (1987), pp. 417-418.--.

UNITED STATES PATENT AND TRADEMARK OFFICE
CERTIFICATE OF CORRECTION

PATENT NO. : 5,019,553

DATED : May 28, 1991

INVENTOR(S) : Jun Akimitsu, et al

It is certified that error appears in the above-identified patent and that said Letters Patent is hereby corrected as shown below:

COLUMN 1

Line 1, "$SR_2(BI_{1-a}PBA)_xCU_yO_z$" should read --$SR_2(BI_{1-a}PB_a)_xCU_yO_z$--.

Line 6, "copper material" should read --copper oxide material, and particularly to a copper oxide material--.

Line 22, "temperature," should read --temperatures,--.

Line 32, "Within" should read --within--.

Line 35, "When" should read --when--.

COLUMN 2

Line 7, "$A_xB_xCu_yO_z$" should read --$A_2B_xCu_yO_z$--.

Line 24, "$A_xB_xCu_yO_z$" should read --$A_2B_xCu_yO_z$--.

Line 32, "combination" should read --combinations--.

Line 33, "includes:" should read --include:--.

Line 35, "$(2) \leqq 2 \leqq 3.5$" should read --$(2) \leqq x \leqq 3.5$--.

Line 37, "$(2) \leqq 2 \leqq 3.5$" should read --$(2) \leqq x \leqq 3.5$--.

Line 40, "0 < a <).4)" should read --0 < a < 0.4)--.

Line 43, "0 < a < 1)" should read --0 < a < 1)--.

Line 46, "0 < x < 1," should read --0 < x < 1,--.

Line 48, "possiblity" should read --possibility--.

Line 50, "there of" should read --thereof--.

Line 60, "materials" should read --material--.

Line 64, "VoI. 17," should read --Vol. 17,--.

UNITED STATES PATENT AND TRADEMARK OFFICE
CERTIFICATE OF CORRECTION

PATENT NO. : 5,019,553

DATED : May 28, 1991

INVENTOR(S) : Jun Akimitsu, et al

It is certified that error appears in the above-identified patent and that said Letters Patent is hereby corrected as shown below:

COLUMN 3

Line 4, "may" should read --may be--.
Line 11, "en" should read --often--.
Line 19, "resistively" should read --resistivity--.
Line 55, "SrCo$_3$" should read --SrCO$_3$--.
Line 58, "10 nm" should read --10 mm--.
Line 59, "1 nm" should read --1 mm--.

COLUMN 4

Line 30, "in" should read --into--.
Line 31, "Table" should read --Table 2.--.
Line 50, "the" should be deleted.
Line 51, "he" should read --the--.

COLUMN 5

Line 10, "SrCo$_3$," should read --SrCO$_3$,--.
Line 14, "of" should read --on-- and "kings" should read --kinds--.

COLUMN 6

Line 8, "Sr$_z$(Bi$_{1-a}$Ph$_a$)$_x$Cu$_y$O$_z$" should read --Sr$_2$(Bi$_{1-a}$Pb$_a$)$_x$Cu$_y$O$_z$--.
Line 11, "$2 \leq X \leq 3.5$" should read --$2 \leq x \leq 3.5$--.

UNITED STATES PATENT AND TRADEMARK OFFICE
CERTIFICATE OF CORRECTION

PATENT NO. : 5,019,553

DATED : May 28, 1991

INVENTOR(S) : Jun Akimitsu, et al

It is certified that error appears in the above-identified patent and that said Letters Patent is hereby corrected as shown below:

COLUMN 6

Line 12, "$2 \leqq Y \leqq 3.5$" should read --$2 \leqq y \leqq 3.5$--.
Line 13, "$X + y \geqq 5$" should read --$x + y \geqq 5$--.
Line 14, "$4 < Z;$" should read --$4 < z;$--.
Line 17, "disappear" should read --disappears--.

Signed and Sealed this

Twenty-second Day of June, 1993

Attest:

MICHAEL K. KIRK

*Attesting Officer*     *Acting Commissioner of Patents and Trademarks*